United States Patent [19]
Chiang et al.

[11] Patent Number: 5,898,626
[45] Date of Patent: *Apr. 27, 1999

[54] REDUNDANCY PROGRAMMING CIRCUIT AND SYSTEM FOR SEMICONDUCTOR MEMORY

[75] Inventors: Paul M-Bhor Chiang; Hung-Mao Lin; Chia-Jen Chang, all of Santa Clara, Calif.

[73] Assignee: Silicon Magic Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/879,208

[22] Filed: Jun. 19, 1997

[51] Int. Cl.$^6$ ........................................................ G11C 7/00
[52] U.S. Cl. ........................................ 365/200; 365/225.7
[58] Field of Search ................................. 365/200, 225.7, 365/230.03, 230.06; 326/10; 327/525, 526

[56] References Cited

U.S. PATENT DOCUMENTS

| | | | |
|---|---|---|---|
| 5,579,266 | 11/1996 | Tahara | 365/200 |
| 5,657,280 | 8/1997 | Shin et al. | 365/200 |
| 5,671,185 | 9/1997 | Chen et al. | 365/200 |
| 5,689,465 | 11/1997 | Sukegawa et al. | 365/200 |
| 5,696,723 | 12/1997 | Tukahara | 365/200 |

*Primary Examiner*—Son Mai
*Attorney, Agent, or Firm*—Sawyer & Associates

[57] ABSTRACT

Circuit, method, and system aspects for achieving redundancy circuitry programming in semiconductor memory are provided. Through these aspects, utilization of a circuit including a logic mechanism for receiving an enable signal and an address signal, a switching mechanism coupled to the logic mechanism for controlling delivery of the address signal, and a fuse mechanism coupled to the logic mechanism for allowing selective address programming responsive to the address signal in order to produce a desired logic level for a redundant address output signal occurs to form an address programming circuit. Further, selective input of an enable signal to the address programming circuit provides control of the address programming circuit to produce a desired logic level output. Additionally, integration of a plurality of the address programming circuits to form a redundancy programming circuit is achieved with each address programming circuit corresponding to one bit of an input address signal.

20 Claims, 4 Drawing Sheets

REDUNDANCY PROGRAMMING CIRCUIT AND SYSTEM FOR SEMICONDUCTOR MEMORY

FIELD OF THE INVENTION

The present invention relates to semiconductor memory circuits and more particularly to redundancy programming for memory circuits.

BACKGROUND OF THE INVENTION

As central processing units for computer systems have undergone constant improvement, the number of bits supported by and the processing speeds for computer systems have continued to increase. With increased processing power remaining a valuable feature for computer systems, matching the improvement in other computer system components has occasionally been difficult. Included in these components is a semiconductor memory component, such as random access memory (RAM) for the computer system.

Usual attempts to improve the RAM of a computer system involve increases in the amount of RAM in the system. Developers attempt to provide a maximum amount of RAM with minimum area consumption. Although the decrease in transistor size has allowed greater density in RAM circuits, the total area does increase, causing the percentage of good die per wafer to decrease. Thus, the ability to repair defective portions of a die becomes more important.

Memory chips typically employ redundancy to supply spare rows/columns of memory cells on the die. The redundant row/columns suitably aid in maintaining higher yield of working die and compensate for processing defects in the die by replacing defective rows/columns. In order to implement the use of the redundant row/columns, the chip is usually programmed with fuses to select the redundant row/column in place of the defective row/column.

Once the defective row/column has been identified, its address is typically programmed for the redundant circuitry in order to allow proper operation of the RAM and rerouting to the redundant circuitry for subsequent selections of the address of the defective row/column. Preprogramming of the redundant circuitry to act as a replacement for the defective row/column typically involves circuitry as shown in FIG. 1. For each address bit transistor 10, e.g., ADD1 to ADDn, there is an associated inverse address bit transistor 12, e.g., ADD1b to ADDnb. Each transistor 10 or 12 further has an associated fuse 14. To program the defective address for the redundant row/column, either the address bit transistor 10 or inverse address bit transistor 12 is deactivated by blowing an appropriate fuse 14.

For each subsequent selection of the defective address, the circuitry of FIG. 1 suitably produces a high voltage output signal, MATCH_ALL, to allow selection of the redundant row/column in place of the defective row/column. However, for each incoming address signal that does not match the defective address, there is at least one current path to ground in the redundant circuitry of FIG. 1. Unfortunately, having a current path draws power, which becomes significant as the number of address bits increases. Further, increases in the number of address bits adds to the size of the circuitry by requiring more signal lines transmitting the address bits and their inverses. Another drawback of this circuitry is that the address signal lines have large capacitive loading even when the redundancy feature has not yet been activated. This drawback leads to greater power consumption and degradation of the speed performance of the chip.

Accordingly, a need exists for improved redundancy programming circuitry that reduces power consumption, size, and speed performance degradation. The present invention addresses such a need.

SUMMARY OF THE INVENTION

In addressing such a need, the present invention provides circuit, method, and system aspects for achieving redundancy circuitry programming in semiconductor memory. In a circuit aspect, the circuit includes a logic mechanism for receiving an enable signal and an address signal, a switching mechanism coupled to the logic mechanism for controlling delivery of the address signal, and a fuse mechanism coupled to the logic means for allowing selective address programming responsive to the address signal in order to produce a desired logic level for a redundant address output signal. In one aspect, the logic mechanism includes a NAND gate and receives a true enable signal. In an alternate aspect, the logic mechanism includes a NOR gate and receives an inverse enable signal.

In a method aspect, the method includes utilizing a switch mechanism, a fuse mechanism and a logic mechanism to form an address programming circuit using CMOS technology, and selectively inputting an enable signal to the address programming circuit in order to control the address programming circuit to produce a desired logic level output. The method further includes integrating a plurality of the address programming circuits to form a redundancy programming circuit, wherein each address programming circuit corresponds with one bit of an input address signal. The method further includes producing a match signal from the redundancy programming circuit based on the output of each address programming circuit, wherein the match signal determines selection of a redundant row/column.

In a system aspect, the system includes a plurality of circuit mechanisms for address programming, each of the plurality of circuit mechanisms further including a logic mechanism for receiving an enable signal and an address signal, a switching mechanism coupled to the logic mechanism for controlling delivery of the address signal, and a fuse mechanism coupled to the logic mechanism for allowing selective address programming responsive to the address signal in order to produce a desired logic level for a redundant address output signal. The system further includes a logic gate coupled to the plurality of circuit mechanisms for receiving the redundant address output signal from each of the plurality of circuit mechanisms and outputting a match signal at a desired level in order to select a redundant row/column in place of a defective row/column.

Through the aspects of the present invention, a more efficient system for providing address programming and selection of redundant circuitry in place of defective circuitry in a semiconductor memory is achieved. The system further lowers power consumptions and more readily accommodates address signals with large numbers of bits while minimizing degradation in speed performance. These and other advantages of the aspects of the present invention will be more fully understood in conjunction with the following detailed description and accompanying drawings.

DETAILED DESCRIPTION

The present invention relates to redundancy programming in semiconductor memory circuits. The following description is presented to enable one of ordinary skill in the art to make and use the invention and is provided in the context of a patent application and its requirements. Various modifications to the preferred embodiment and the generic principles and features described herein will be readily apparent to those skilled in the art.

Figure 1:
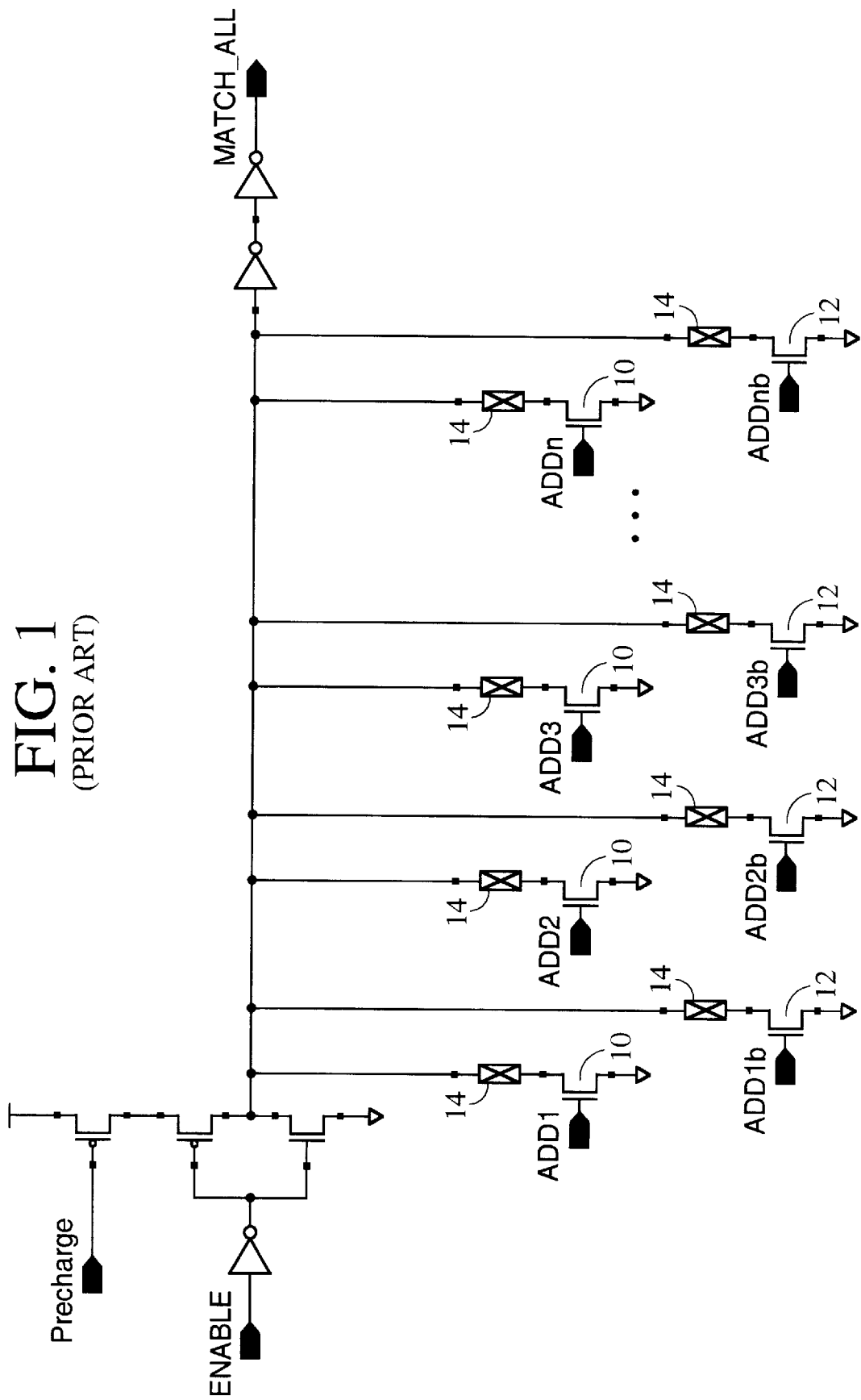
FIG. 1 illustrates a redundancy programming circuit of the prior art.
Figure 2:
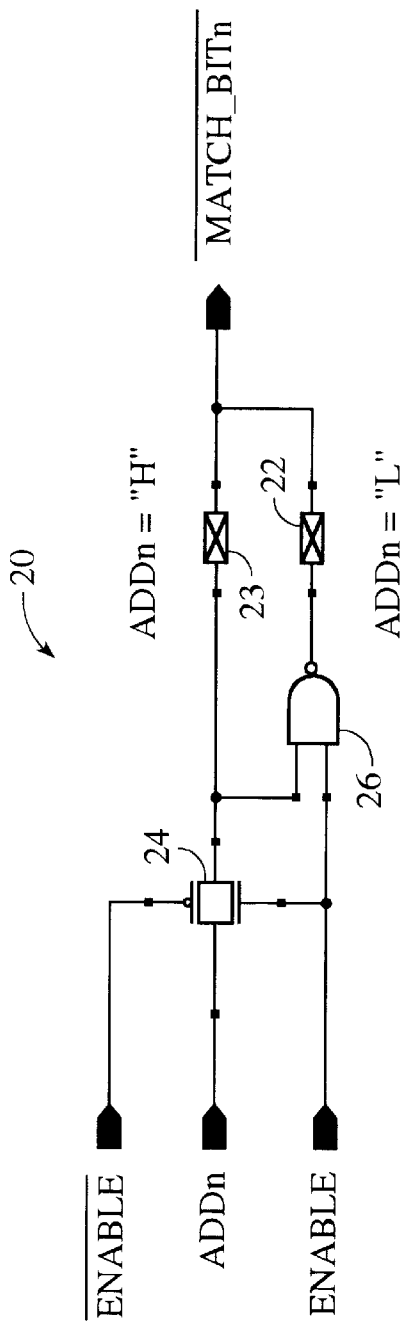
FIG. 2 illustrates a circuit for programming an address bit for redundancy circuitry in accordance with the present invention.

FIG. 2 illustrates circuitry in accordance with the present invention to achieve efficient address programming for redundant rows/columns in a semiconductor memory. The circuit 20 of FIG. 2 includes fuses 22 and 23, which are suitably blown according to whether a high logic level, $ADDn=$"H", or low logic level, $ADDn=$"L", of the address signal is necessary to match a defective row/column address, resulting in a low level output signal, $\overline{MATCH\_BIT}_n$. A true enable signal, ENABLE, and its inverse, $\overline{ENABLE}$, are also included and utilized via a switch 24 and a logic mechanism 26, e.g., a NAND gate, to provide the appropriate logic level on output signal $\overline{MATCH\_BIT}_n$ when selection of a redundant row/column is desired.

Figure 3:
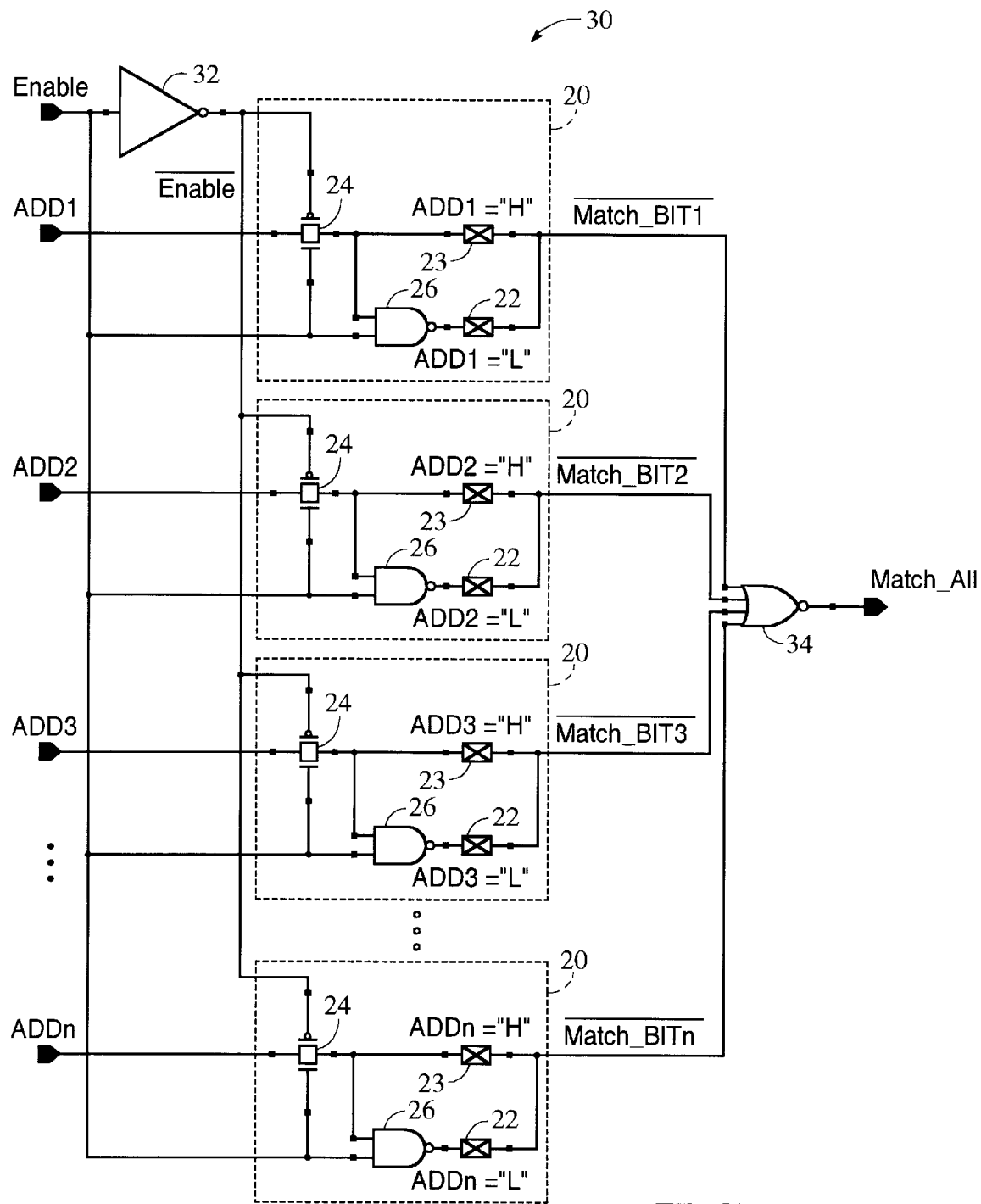
FIG. 3 illustrates a redundancy programming circuit incorporating the address programming circuit of FIG. 2.

FIG. 3 illustrates integration of the address programming circuit 20 of FIG. 2 to form a redundancy programming circuit 30. As shown, an inverter 32 is suitably included to produce the inverse of the ENABLE signal, $\overline{ENABLE}$. In operation, in order to allow selection of the redundant row/column in place of a defective row/column, suitably the circuit 30 produces a high level output signal, MATCH_ALL. Thus, each circuit 20 must output an appropriate low logic level signal to result in the high level MATCH_ALL signal from NOR gate 34.

By way of example, suppose a 'H' level on bits one, three, and 'n' of the address signal, ADD1, ADD3, and ADDn, with a low 'L' level signal on the remaining address bits, ADD2 and ADD4 to ADDn−1, addresses a defective row to be replaced by a redundant row. Suitably then, fuses 23 of circuit 20 for bits ADD1, ADD3, and ADDn are blown, while fuses 22 for bits ADD2, and ADD4 to ADDn−1 are blown. When the ENABLE signal is provided at a high logic level to allow address matching determinations to occur, switches 24 are opened. For each circuit 20, a high level ENABLE signal input into NAND gate 26 with a high level address bit signal results in a low level from the NAND gate 26. Conversely, a high level ENABLE signal input with a low level address bit signal results in a high level output from NAND gate 26. When matching address bits, the blowing of fuse 23 allows the low level output from the NAND gate 26 resulting from high level address bits, e.g., ADD1, ADD3, ADDn, of the address signal to supply a low level input to the NOR gate 34, while the blowing of fuse 22 allows low level address bits, e.g., ADD2 and ADD4 to ADDn−1, to supply a low level input to the NOR gate 34. Thus, through the use of the circuit 30, an input address signal matching an address for a defective row/column properly results in high level MATCH_ALL signal to allow selection of the redundant row/column.

Figure 4:
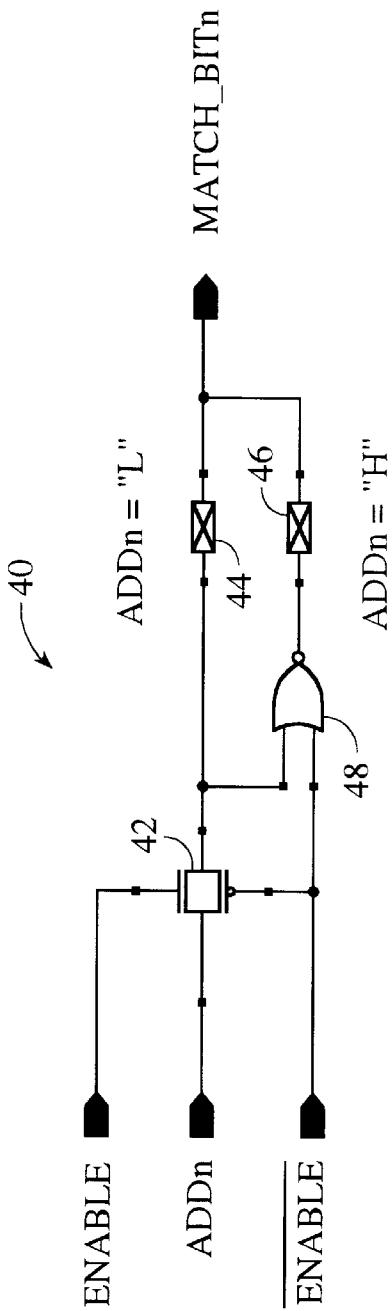
FIG. 4 illustrates an alternate embodiment for the circuit of FIG. 2.
Figure 5:
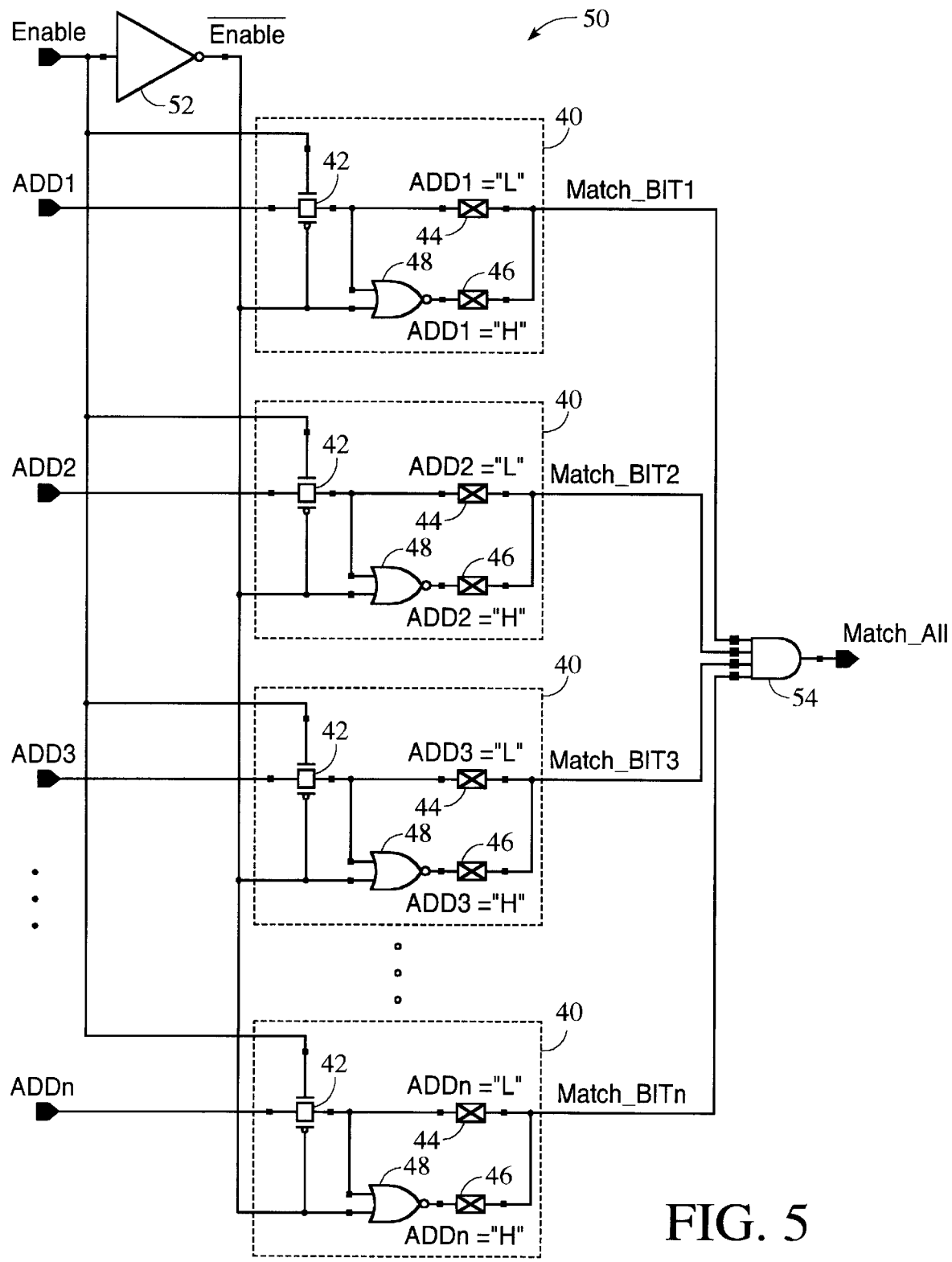
FIG. 5 illustrates an alternate embodiment for the circuit of FIG. 3.

An alternate arrangement for address programming and redundancy programming is presented with reference to FIGS. 4 and 5. As shown in FIG. 4, an address programming circuit 40 includes a switch 42 and fuses 44 and 46. In the alternate embodiment of FIG. 4, a NOR gate acts as logic mechanism 48 and receives the inverse enable signal, $\overline{ENABLE}$, as an input.

Integration of the circuit 40 for redundancy programming is illustrated in the circuit 50 of FIG. 5. An inverter 52 is included to produce the $\overline{ENABLE}$ signal. With the ENABLE signal at a high level, a low level $\overline{ENABLE}$ results via the inverter 52, the switches 42 are opened, and the NOR gates 48 each receive the low level $\overline{ENABLE}$ signal on one input. In order to achieve a high level MATCH_ALL signal from AND gate 54 for an incoming address that matches a defective address, the fuses 44 and 46 of each circuit 40 are blown appropriately to produce high level inputs to the AND gate 54. Using the above-described example, for address bits 1, 3, and n, the fuses 46 would be blown, while fuses 44 would be blown for address bit 2 and address bits 4 through n−1.

In accordance with the embodiments of the present invention, the logic for the circuitry is suitably provided as CMOS logic to aid in the reduction of power consumption and to ensure that there is no open or DC current path from a power supply to ground. Further, the use of the enable signal to enable the redundancy eliminates the need for a precharge, thus eliminating any leakage paths. Additionally, the enable signal allows more flexible and efficient control of utilization of the redundancy programming including inhibiting the circuitry when there are no defective rows/columns. Thus, in both the NAND gate and NOR gate implementations of the redundancy circuitry described above, when the redundancy mechanism is disabled, the ENABLE signal is suitably provided at a low logic level and no fuses are blown. This results in a low logic level at the MATCH_ALL signal, regardless of the address bit inputs. Disabling the redundancy circuitry in this manner greatly reduces the capacitive loading on the address signal lines, thus improving the speed performance of the semiconductor memory.

Although the present invention has been described in accordance with the embodiments shown, one of ordinary skill in the art will recognize that there could be variations to the embodiment and those variations would be within the spirit and scope of the present invention. For example, although two preferred embodiment of address and redundancy programming circuits are provided, other combinations of logic gates could be implemented to achieve the selection redundant circuitry. Accordingly, many modifications may be made by one of ordinary skill without departing from the spirit and scope of the present invention, the scope of which is defined by the following claims.

What is claimed is:

1. A circuit for achieving redundancy circuitry programming in semiconductor memory, the circuit comprising:

logic means for receiving an enable signal and an address signal;

switching means coupled to the logic means, the switching means being responsive to the enable signal for controlling delivery of the address signal to the logic means; and fuse means coupled to the logic means and switching means for allowing selective address programming responsive to the address signal in order to produce a desired logic level for a redundant address output signal.

2. The circuit of claim 1 wherein the circuit is implemented in CMOS logic, wherein the CMOS logic aids in reduction of power consumption by the circuit.

3. The circuit of claim 1 wherein the logic means comprises a NAND gate.

4. The circuit of claim 3 wherein the NAND gate receives a true enable signal.

5. The circuit of claim 1 wherein the logic means comprises a NOR gate.

6. The circuit of claim 5 wherein the NOR gate receives an inverse enable signal.

7. A method for achieving redundancy programming in semiconductor memory, the method comprising:
   utilizing switch means, fuse means and logic means to form an address programming circuit using CMOS technology; and
   selectively inputting an enable signal to the address programming circuit at one of a logic level and an inverse of the logic level in order to control the address programming circuit to produce a desired logic level output.

8. The method of claim 7 further comprising integrating a plurality of the address programming circuits to form a redundancy programming circuit, wherein each address programming circuit corresponds with one bit of an input address signal.

9. The method of claim 8 further comprising producing a match signal from the redundancy programming circuit based on the output of each address programming circuit, wherein the match signal determines selection of a redundant row/column.

10. The method of claim 7 wherein utilizing further comprises utilizing a NAND gate for the logic means.

11. The method of claim 10 wherein selectively inputting further comprises providing the enable signal to the switching means and the NAND gate.

12. The method of claim 7 wherein utilizing further comprises utilizing a NOR gate for the logic means.

13. The method of claim 12 wherein selectively inputting further comprises providing an inverse of the enable signal to the NOR gate.

14. A system for achieving redundancy programming in semiconductor memory, the system comprising:
   a plurality of circuit means for address programming, each of the plurality of circuit means further comprising:
      logic means for receiving an enable signal and an address signal;
      switching means coupled to the logic means, the switching means being responsive to the enable signal for controlling delivery of the address signal to the logic means; and
      fuse means coupled to the logic means and switching means for allowing selective address programming responsive to the address signal in order to produce a desired logic level for a redundant address output signal; and
   a logic gate coupled to the plurality of circuit means for receiving the redundant address output signal from each of the plurality of circuit means and outputting a match signal at a desired level in order to select a redundant row/column in place of a defective row/column.

15. The system of claim 14 wherein the logic gate comprises a NOR gate.

16. The system of claim 14 wherein the at least one circuit means and the logic gate are implemented in CMOS logic.

17. The system of claim 14 wherein the logic means of each of the plurality of circuit means farther comprises a NAND gate.

18. The method of claim 7, wherein the address programming circuit control includes disabling the address programming circuit, and wherein the disabling of the address programming circuit greatly reduces capacitive loading on address lines.

19. The system of claim 14, wherein the logic means of each of the plurality of circuit means comprises a NOR gate.

20. A circuit for achieving redundancy circuitry programming in semiconductor memory, the circuit comprising:
   means for providing an enable signal, the enable signal providing means comprising a logic gate;
   logic means coupled to the enable signal providing means for receiving the enable signal at a first input, the logic means for receiving an address signal at a second input;
   switching means coupled to the enable providing means and the logic means, the switching means being responsive to the enable signal for controlling delivery of the address signal to the logic means, wherein the controlling includes disabling the circuit, and wherein the disabling greatly reduces capacitive loading on address lines; and
   fuse means coupled to the logic means and switching means for allowing selective address programming responsive to the address signal in order to produce a desired logic level for a redundant address output signal.

* * * * *